(12) United States Patent
Huang et al.

(10) Patent No.: US 8,399,303 B1
(45) Date of Patent: Mar. 19, 2013

(54) METHOD FOR MANUFACTURING MODULARIZED INTEGRATED CIRCUIT

(75) Inventors: Chun-Ming Huang, Hsinchu (TW); Chi-Sheng Lin, Hsinchu (TW); Chi-Shi Chen, Hsinchu (TW); Chien-Ming Wu, Hsinchu (TW)

(73) Assignee: National Chip Implementation Center National Applied Research Laboratories, Hsinchu (TW)

( * ) Notice: Subject to any disclaimer, the term of this patent is extended or adjusted under 35 U.S.C. 154(b) by 0 days.

(21) Appl. No.: 13/308,604

(22) Filed: Dec. 1, 2011

(30) Foreign Application Priority Data

Oct. 25, 2011  (TW) .............................. 100138743 A

(51) Int. Cl.
*H01L 21/44* (2006.01)
*H01L 21/48* (2006.01)
(52) U.S. Cl. .. 438/123; 438/124; 438/127; 257/E23.054
(58) Field of Classification Search .................. 438/123, 438/124, 127
See application file for complete search history.

(56) References Cited

U.S. PATENT DOCUMENTS

| | | | | |
|---|---|---|---|---|
| 7,050,303 B2* | 5/2006 | Park et al. | ...... | 361/715 |
| 7,166,496 B1* | 1/2007 | Lopez et al. | ...... | 438/110 |
| 2004/0087043 A1* | 5/2004 | Lee et al. | ...... | 438/6 |
| 2009/0189291 A1* | 7/2009 | Landau et al. | ...... | 257/777 |
| 2009/0206458 A1* | 8/2009 | Andrews et al. | ...... | 257/676 |
| 2010/0127396 A1* | 5/2010 | Tang | ...... | 257/773 |
| 2010/0172652 A1* | 7/2010 | Wong et al. | ...... | 398/140 |
| 2011/0140253 A1* | 6/2011 | Lee et al. | ...... | 257/676 |

* cited by examiner

*Primary Examiner* — Alexander Ghyka
(74) *Attorney, Agent, or Firm* — Stites & Harbison, PLLC; Juan Carlos A. Marquez, Esq

(57) ABSTRACT

The present invention provides a method for manufacturing a modularized integrated circuit (IC). The method includes the following steps: providing a base; and coupling an input/output module with the base. The base includes a lead-frame and a first package. The first package covers the lead-frame but exposes first contact points. The input/output module includes a first substrate, a plurality of first conducting columns, and a plurality of third contact points. A portion of each of the third contact points is electrically connected to a corresponding one of the first contact points. The method enhances the flexibility of IC design, and reduces the time and costs of developing new process techniques.

10 Claims, 6 Drawing Sheets

METHOD FOR MANUFACTURING MODULARIZED INTEGRATED CIRCUIT

BACKGROUND OF THE INVENTION

1. Technical Field

The present invention relates to methods for manufacturing a modularized integrated circuit, and more particularly, to a method for manufacturing a modularized integrated circuit for use with System on Chip (SoC) integrated circuits.

2. Description of Related Art

Due to rapid technological development, integrated circuits nowadays have increasingly powerful functions, contain an increasing number of components, and feature a core circuit with an increasingly complicated structure; hence, the required number of input/output pins of an integrated circuit is ever-increasing. With its dimensions being ever-decreasing, the core circuit of an integrated circuit has to be manufactured by an advanced process in order to be capable of accommodating increasingly abundant components and increasingly intricate circuits.

In the aforesaid situation, a conventional method for manufacturing an integrated circuit by a single manufacturing process is confronted with a problem as follows: to provide sufficiently high current propulsion, high electrostatic discharge protection, high noise immunity, and high latch-up protection, an input/output circuit is not downsized proportionally to the core circuit manufactured by an advanced process but is even oversize when compared to circuits manufactured by a common process. If the input/output circuit is manufactured by the same advanced process as the core circuit is, its costs will increase greatly. Hence, the aforesaid consideration has to be given to core circuit design and thus undesirably imposes limitations thereon.

In response to the ever-increasing components of a core circuit, the technology related to the advanced process for manufacturing core circuits keeps evolving. Every instance of the introduction of a novel process is accompanied by a new search for design methodology that strikes a balance between meeting the requirements of high current propulsion, high electrostatic discharge protection, high noise immunity, and high latch-up protection and avoiding an increase in the overall dimensions of an integrated circuit. The new search incurs much R&D (research and development) costs and time.

SUMMARY OF THE INVENTION

The present invention relates to a method for manufacturing a modularized integrated circuit. The method comprises the steps of: providing a base; and coupling an input/output module with the base. The present invention provides the method for manufacturing a modularized integrated circuit so as to enhance the flexibility of integrated circuit (IC) design and reduce the time and costs of developing new process techniques.

The present invention provides a method for manufacturing a modularized integrated circuit, comprising the steps of: providing a base, the base having a lead-frame and a first package, the lead-frame having a plurality of first contact points and a plurality of second contact points, and the first package encapsulating the lead-frame but exposing the first contact points and the second contact points; and coupling a first input/output module with the base by coupling and electrically connecting the first input/output module and the first contact points, the first input/output module comprising: a first substrate being a wafer and having a first surface and a second surface; an input/output circuit having a plurality of first conductive panels thereon and formed on the first surface; a plurality of first conducting columns disposed inside the first substrate, wherein one end of each of the first conducting columns is electrically connected to the input/output circuit; and a plurality of third contact points formed on the second surface, wherein a portion of each of the third contact points is electrically connected to another end of each of the first conducting columns, and another portion of each of the third contact points is electrically connected to a corresponding one of the first contact points.

The present invention also provides a method for manufacturing a modularized integrated circuit, comprising the steps of: providing a base, the base having a lead-frame and a first package, the lead-frame having a plurality of first contact points and a plurality of second contact points, the first package encapsulating the lead-frame but exposing the first contact points and the second contact points; and coupling a second input/output module with the base by coupling and electrically connecting the second input/output module and the first contact points, the second input/output module comprising: a first substrate being a wafer and having a first surface and a second surface; a plurality of first conductive panels formed on the first surface; a plurality of first conducting columns disposed inside the first substrate, wherein one end of each of the first conducting columns is electrically connected to the first conductive panels; and an input/output circuit formed on the second surface, electrically connected to another end of each of the first conducting columns, and having a plurality of second conductive panels each electrically connected to a corresponding one of the first contact points.

Implementation of the present invention at least involves inventive steps as follows:

1. Enhancing the flexibility of integrated circuit design by modularizing input/output module.
2. Reducing R&D time and cutting R&D costs.
3. Reducing the area required for an advance process and cutting chip fabrication costs.

The detailed features and advantages of the present invention will be described in detail with reference to the preferred embodiment so as to enable persons skilled in the art to gain insight into the technical disclosure of the present invention, implement the present invention accordingly, and readily understand the objectives and advantages of the present invention by perusal of the contents disclosed in the specification, the claims, and the accompanying drawings.

DETAILED DESCRIPTION OF THE EMBODIMENTS OF THE INVENTION

First Embodiment

Figure 1:
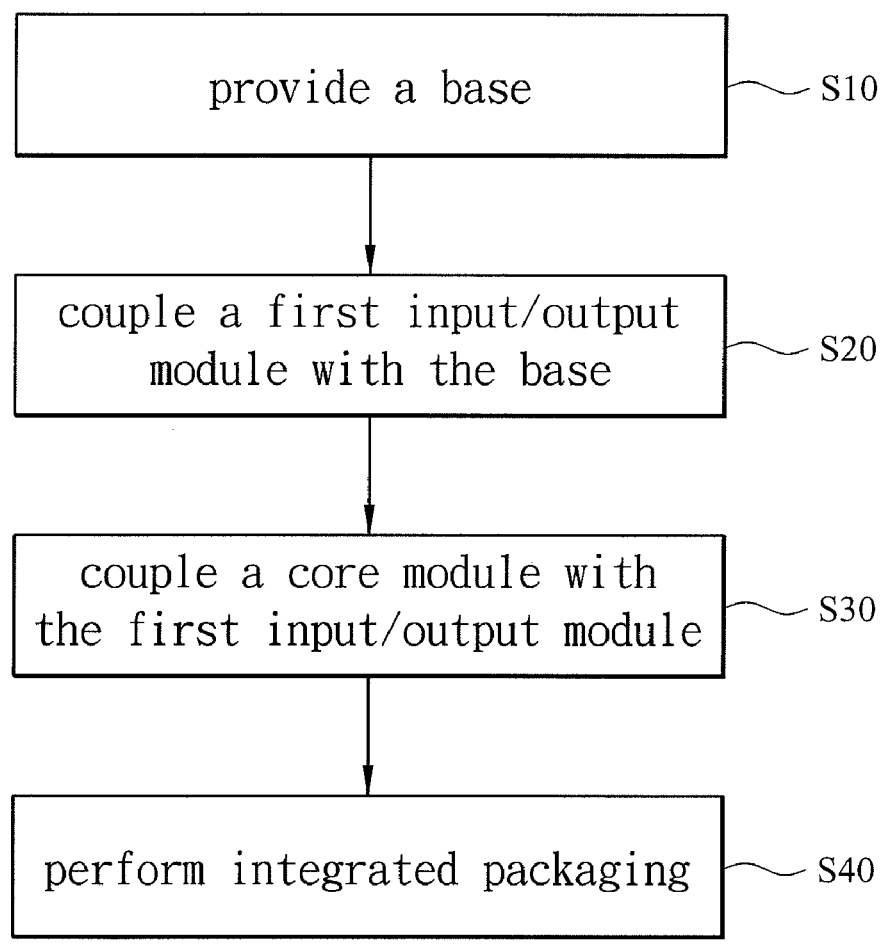
FIG. 1 is a flow chart of a method for manufacturing a modularized integrated circuit according to the first embodiment of the present invention.

Referring to FIG. 1, there is shown a flow chart of a method for manufacturing a modularized integrated circuit according to the first embodiment of the present invention. As shown in FIG. 1, the method in the first embodiment of the present invention comprises the steps of: providing a base (step S10); coupling a first input/output module with the base (step S20); coupling a core module with the first input/output module (step S30); and performing integrated packaging (step S40).

Figure 2:
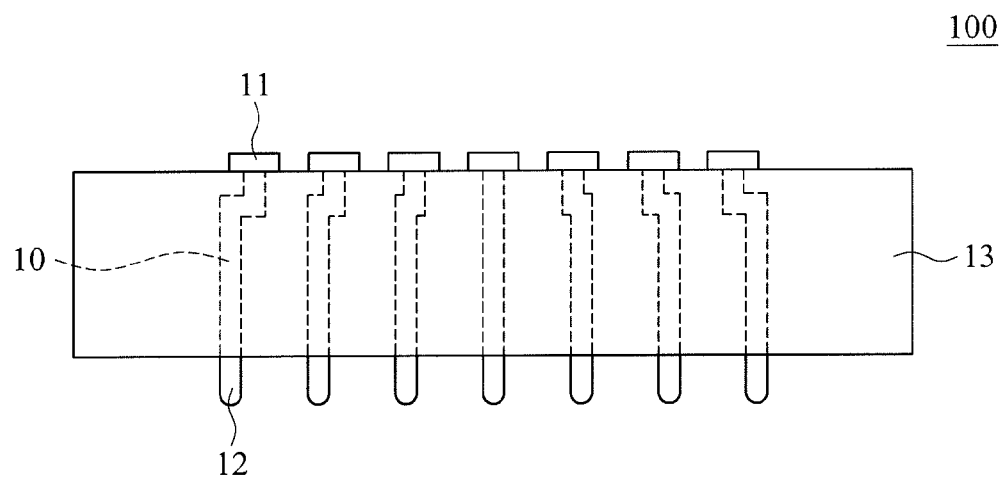
FIG. 2 is a structural schematic view of a base according to the first embodiment of the present invention.

Referring to FIG. 2, regarding the step of providing a base (step S10), a base 100 has a lead-frame 10 and a first package 13. The lead-frame 10 is made of a conductive metal and has a plurality of first contact points 11 and a plurality of second contact points 12. The first package 13 is made of a plastic material and adapted to encapsulate the lead-frame 10. The base 100 is manufactured in the same way as integrated circuits (IC) in general are packaged, that is, enclosing and encapsulating the lead-frame 10 with the first package 13. However, to allow the lead-frame 10 to bring its electrical function or telecommunication transmission function into full play, the first package 13 encapsulates the lead-frame 10 but exposes the first contact points 11 and the second contact points 12. The first contact points 11 are exposed from the upper surface of the base 100. The second contact points 12 are exposed from the lower surface of the base 100.

Figure 3:
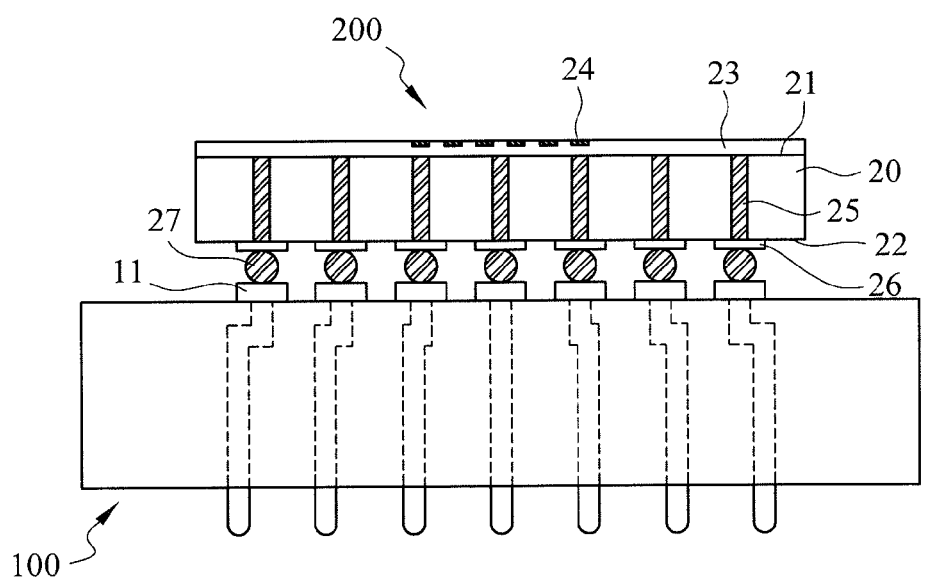
FIG. 3 is a structural schematic view of a base and a first input/output module which are coupled together according to the first embodiment of the present invention.

Referring to FIG. 3, the step of coupling a first input/output module with the base (step S20) involves coupling and electrically connecting a first input/output module 200 and the first contact points 11. The first input/output module 200 comprises a first substrate 20, an input/output circuit 23, a plurality of first conducting columns 25, and a plurality of third contact points 26.

The first substrate 20 is a wafer. The first substrate 20 is fabricated and processed by a wafer-level process. The first substrate 20 has a first surface 21 and a second surface 22. The first surface 21 is the upper surface of the first substrate 20. The second surface 22 is the lower surface of the first substrate 20.

The input/output circuit 23 is produced by a photolithography process and formed on the first surface 21. The input/output circuit 23 comprises one or more self-contained circuits connected in series and connected in parallel. From the perspective of a core circuit (not shown), the input/output circuit 23 provides diverse ways of connecting the modules in the core circuit (not shown). A plurality of first conductive panels 24 is disposed at the input/output circuit 23 and thus can be electrically connected to the core circuit (not shown). From the perspective of the base 100, the input/output circuit 23 provides a route for power transmission or telecommunication transmission between the base 100 and the core circuit (not shown).

The first conducting columns 25 are made of a conductive metal and disposed inside the first substrate 20 to penetrate the first substrate 20. Hence, one end of each of the first conducting columns 25 is electrically connected to the input/output circuit 23.

The third contact points 26 are formed on the second surface 22. A portion of each of the third contact points 26 is electrically connected to the other end of each of the first conducting columns 25. Hence, each of the third contact points 26 is electrically connected to the input/output circuit 23 via the first conducting columns 25. The other portion of each of the third contact points 26 is electrically connected to a corresponding one of the first contact points 11 on the base 100 via a plurality of solder balls 27.

Accordingly, the step of coupling a first input/output module with the base entails electrically connecting the third contact points 26 of the first input/output module 200 to the first contact points 11 on the base 100 via the plurality of solder balls 27.

Figure 4:
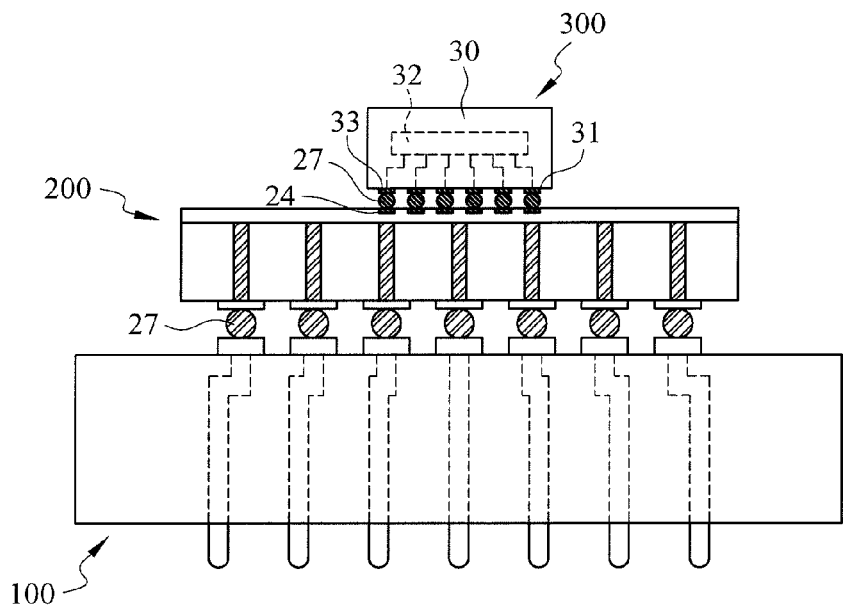
FIG. 4 is a structural schematic view of a base, a first input/output module, and a core module which are coupled together according to the first embodiment of the present invention.

Referring to FIG. 4, the step of coupling a core module with the first input/output module (step S30) involves coupling and electrically connecting a core module 300 and the first input/output module 200. From the perspective of a microprocessor, the core module 300 can be a processing unit, a control unit, or a memory unit. The core module 300 comprises a second substrate 30 and a core circuit 32.

The second substrate 30 is a wafer. The second substrate 30 is fabricated and processed by a wafer-level process. The second substrate 30 has a third surface 31. The third surface 31 is the lower surface of the second substrate 30. A plurality of fourth contact points 33 is disposed on the third surface 31.

The core circuit 32 is formed inside the second substrate 30 and electrically connected to the fourth contact points 33. The core circuit 32 is manufactured by an advanced process of high precision, so as to meet the requirements for dimensions, quantity, performance, and density of the components of the core circuit 32. A portion of the fourth contact points 33 is electrically connected to the core circuit 32. The other portion of the fourth contact points 33 is coupled and electrically connected to the first conductive panels 24 via the plurality of solder balls 27, such that signals input to and/or output from the core circuit 32 are sent to the first input/output module 200 and then sent to the base 100 through the first input/output module 200.

Accordingly, the step of coupling a core module with the first input/output module entails electrically connecting the fourth contact points 33 to the first conductive panels 24 of the input/output circuit 23 in the first input/output module 200 via the plurality of solder balls 27.

Figure 5:
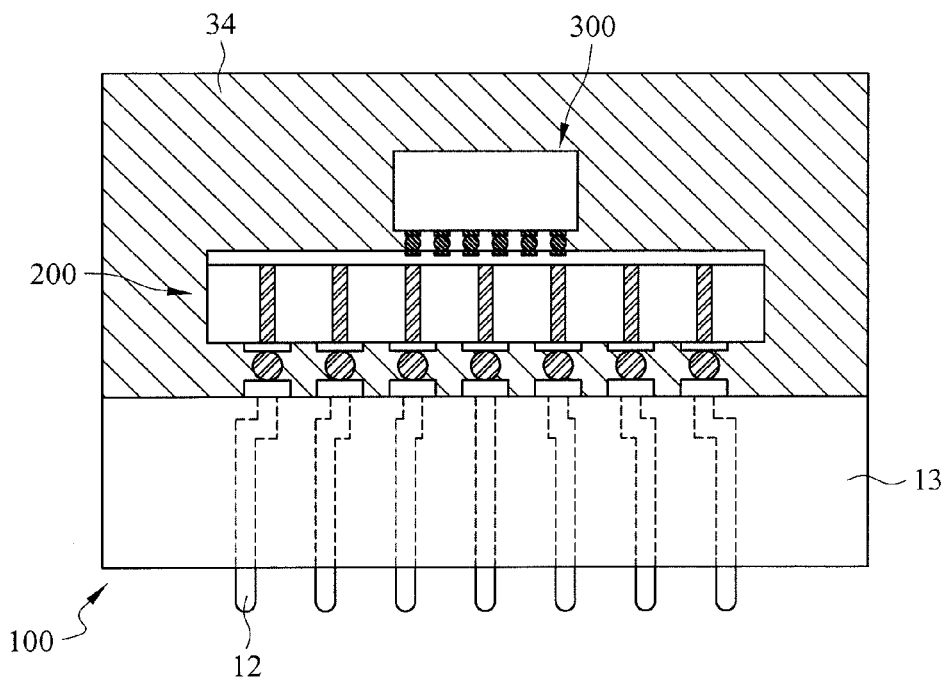
FIG. 5 is a structural schematic view of a modularized integrated circuit after performing integrated packaging according to the first embodiment of the present invention.

Referring to FIG. 5, the step of performing integrated packaging (step S40) is aimed at packaging the base 100, the first input/output module 200, and the core module 300 by coupling a second package 34 and the first package 13 together. The second package 34 for use in the step of performing integrated packaging is made of a plastic material. As regards packaging, the base 100, the first input/output module 200, and the core module 300 are enclosed and encapsulated by injection molding with the second package 34. With the second contact points 12 being intended for use in coupling and electrically connecting the modularized integrated circuit and an external application circuit, it is still necessary to expose the second contact points 12 after performing the step of performing integrated packaging. Also, the second contact points 12 are provided in the form of solder joints or pins, depending on the way of coupling.

Second Embodiment

Figure 6:
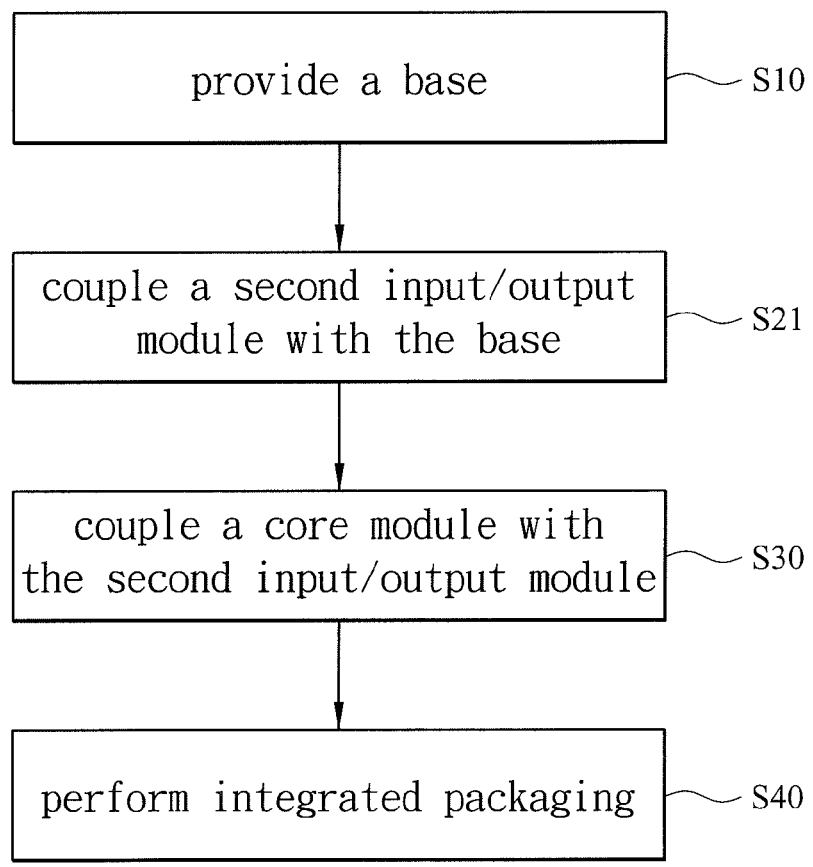
FIG. 6 is a flow chart of a method for manufacturing a modularized integrated circuit according to the second embodiment of the present invention.

Referring to FIG. 6, there is shown a flow chart of a method for manufacturing a modularized integrated circuit according to the second embodiment of the present invention. As shown in FIG. 6, the method in the second embodiment of the present invention comprises the steps of: providing a base (step S10); coupling a second input/output module with the base (step S21); coupling a core module with the second input/output module (step S30); and performing integrated packaging (step S40).

Referring to FIG. 2, regarding the step of providing a base (step S10), the base 100 has a lead-frame 10 and a first package 13. The lead-frame 10 is made of a conductive metal and has a plurality of first contact points 11 and a plurality of second contact points 12. The first package 13 is made of a plastic material and adapted to encapsulate the lead-frame 10. The base 100 is manufactured in the same way as integrated circuits (IC) in general are packaged, that is, enclosing and encapsulating the lead-frame 10 with the first package 13. However, to allow the lead-frame 10 to bring its electrical function or telecommunication transmission function into full play, the first package 13 encapsulates the lead-frame 10 but exposes the first contact points 11 and the second contact points 12. The first contact points 11 are exposed from the upper surface of the base 100. The second contact points 12 are exposed from the lower surface of the base 100.

Figure 7:
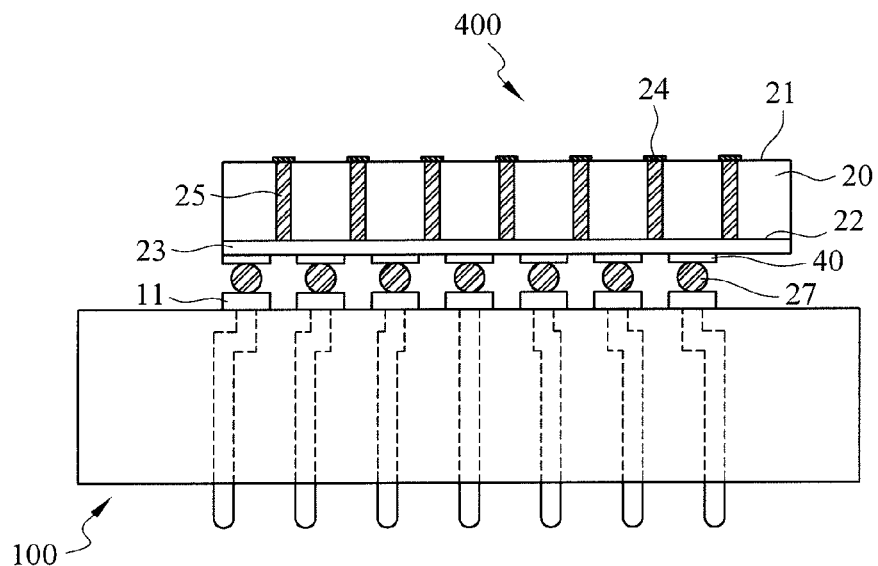
FIG. 7 is a structural schematic view of a base and a second input/output module which are coupled together according to the second embodiment of the present invention.

Referring to FIG. 7, the step of coupling a second input/output module with the base (step S21) involves coupling and electrically connecting a second input/output module 400 and the first contact points 11. The second input/output module 400 comprises a first substrate 20, a plurality of first conductive panels 24, a plurality of first conducting columns 25, and an input/output circuit 23.

The first substrate 20 is a wafer. The first substrate 20 is fabricated and processed by a wafer-level process. The first substrate 20 has a first surface 21 and a second surface 22. The first surface 21 is the upper surface of the first substrate 20. The second surface 22 is the lower surface of the first substrate 20.

The first conductive panels 24 are formed on the first surface 21, that is, the upper surface of the first substrate 20. One side of each of the first conductive panels 24 is electrically connected to one end of a corresponding one of the first conducting columns 25. The other side of each of the first conductive panels 24 is electrically connected to a core module (not shown).

The first conducting columns 25 are made of a conductive metal and disposed inside the first substrate 20 to penetrate the first substrate 20. Hence, one end of each of the first conducting columns 25 is electrically connected to the first conductive panels 24, whereas the other end of each of the first conducting columns 25 is electrically connected to the input/output circuit 23. The input/output circuit 23 is electrically connected to a core circuit (not shown) via the first conducting columns 25 and the first conductive panels 24, such that there are diverse ways of connecting the modules in the core circuit (not shown).

The input/output circuit 23 is produced by a photolithography process and formed on the second surface 22. The input/output circuit 23 comprises one or more self-contained circuits connected in series and connected in parallel. From the perspective of a core circuit (not shown), the input/output circuit 23 provides diverse ways of connecting the modules in the core circuit (not shown). From the perspective of the base 100, the input/output circuit 23 provides a route for power transmission or telecommunication transmission between the base 100 and the core circuit (not shown). A plurality of second conductive panels 40 is disposed at the input/output circuit 23. A portion of each of the second conductive panels 40 is electrically connected to a corresponding one of the first contact points 11 on the base 100 via a plurality of solder balls 27.

Accordingly, the step of coupling a second input/output module with the base 100 entails electrically connecting the second conductive panels 40 of the second input/output module 400 to the first contact points 11 on the base 100 via the plurality of solder balls 27.

Figure 8:
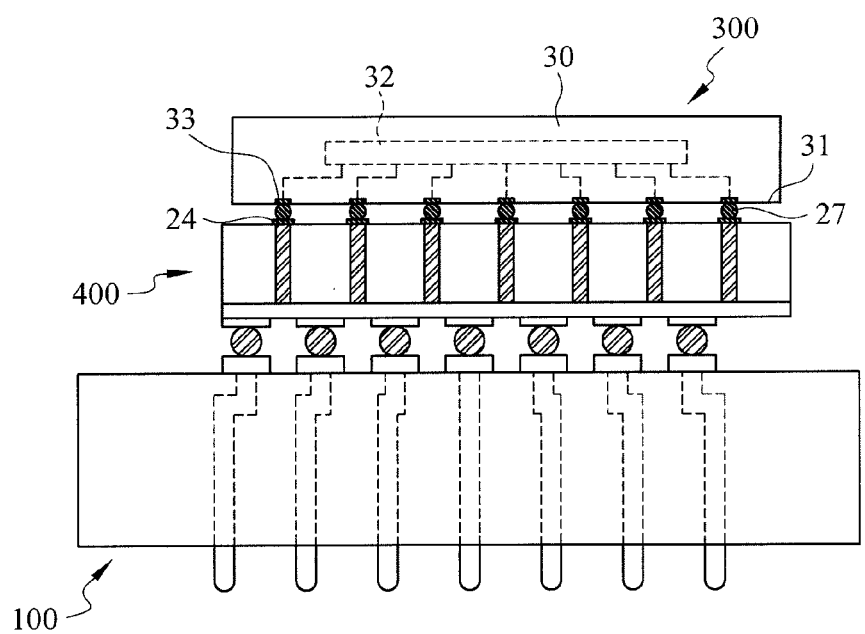
FIG. 8 is a structural schematic view of a base, a second input/output module, and a core module which are coupled together according to the second embodiment of the present invention.

Referring to FIG. 8, the step of coupling a core module with the second input/output module (step S30) involves coupling and electrically connecting the core module 300 and the second input/output module 400 together and electrically connecting the fourth contact points 33 of the core module 300 to the first conductive panels 24 of the second input/output module 400 via the solder balls 27, respectively. The step of coupling a core module with the second input/output module (step S30) in the second embodiment equals the step of coupling a core module with the first input/output module (step S30) in the first embodiment substantially in terms of function, means, and outcome and thus is not described in detail herein for the sake of brevity.

Figure 9:
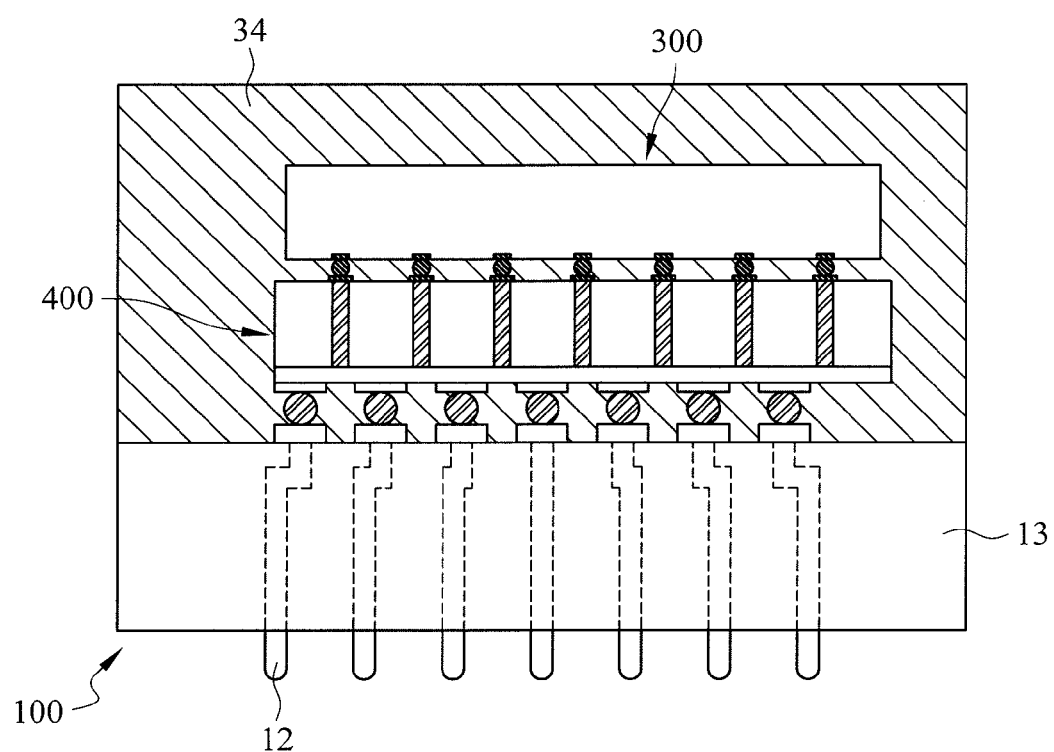
FIG. 9 is a structural schematic view of another modularized integrated circuit after performing integrated packaging according to the second embodiment of the present invention.

Referring to FIG. 9, the step of performing integrated packaging (step S40) is aimed at packaging the base 100, the second input/output module 400, and the core module 300 but still exposing the second contact points 12, by coupling a second package 34 and the first package 13 together. The step of performing integrated packaging (step S40) in the second embodiment equals the step of performing integrated packaging (step S40) in the first embodiment substantially in terms of function, means, and outcome and thus is not described in detail herein for the sake of brevity.

By following the aforesaid steps, the above embodiments provide a simple method for designing and manufacturing a modularized integrated circuit, such that a core module and an input/output module are manufactured by different processes, respectively, so as to solve problems facing integrated circuit design. For example, an input/output module is implemented by a process suitable for use in designing an input/output circuit, such that the input/output module manifests high current propulsion, high electrostatic discharge protection, high noise immunity, and high latch-up protection. Furthermore, with the core module implemented by an appropriate advanced process to allow the core circuit and the input/output circuit to be present in different modules, respectively, the core circuit is effectively protected against noise interference arising from the input/output circuit, such that an integrated circuit thus manufactured manifests high noise immunity, thereby circumventing various problems which might otherwise confront the input/output module during a process.

Besides, it is feasible to manufacture a base having an input/output module coupled thereto by mass production and apply the base to core modules of various uses. Integrated circuit designers can focus their efforts on a core module to save plenty of R&D time, enhance the flexibility of integrated circuit design, and cut manufacturing costs greatly.

Furthermore, for those products which are characterized by a standard design of input/output circuits, their input/output circuits do not vary with the evolution of a process, and thus it is feasible to come up with a unique design of an input/output module having a standard input/output circuit to thereby cut production costs and enhance the reliability of the input/output module.

The features of the present invention are disclosed above by the preferred embodiment to allow persons skilled in the art to gain insight into the contents of the present invention and implement the present invention accordingly. The preferred embodiment of the present invention should not be interpreted as restrictive of the scope of the present invention. Hence, all equivalent modifications or amendments made to the aforesaid embodiment should fall within the scope of the appended claims.

What is claimed is:

1. A method for manufacturing a modularized integrated circuit, comprising the steps of:
    providing a base, the base having a lead-frame and a first package, the lead-frame having a plurality of first contact points and a plurality of second contact points, and the first package encapsulating the lead-frame but exposing the first contact points and the second contact points; and
    coupling an input/output module with the base by coupling and electrically connecting the input/output module and the first contact points, the input/output module comprising:
        a first substrate being a wafer and having a first surface and a second surface;
        an input/output circuit having a plurality of first conductive panels thereon and formed on the first surface;
        a plurality of first conducting columns disposed inside the first substrate, wherein one end of each of the first conducting columns is electrically connected to the input/output circuit; and
        a plurality of third contact points formed on the second surface, wherein a portion of each of the third contact points is electrically connected to another end of each of the first conducting columns, and another portion of each of the third contact points is electrically connected to a corresponding one of the first contact points.

2. The method of claim 1, wherein the third contact points are coupled and electrically connected to the first contact points via a plurality of solder balls.

3. The method of claim 1, further comprising a step of coupling a core module with the input/output module by coupling and electrically connecting the core module and the input/output module, the core module comprising:
    a second substrate having a third surface, wherein a plurality of fourth contact points is disposed on the third surface and coupled and electrically connected to the first conductive panels; and
    a core circuit formed inside the second substrate and electrically connected to the fourth contact points.

4. The method of claim 3, wherein the fourth contact points are coupled and electrically connected to the first conductive panels via a plurality of solder balls.

5. The method of claim 4, further comprising a step of performing integrated packaging for packaging the base, the input/output module, and the core module and still exposing the second contact points, by coupling a second package and the first package.

6. A method for manufacturing a modularized integrated circuit, comprising the steps of:
    providing a base, the base having a lead-frame and a first package, the lead-frame having a plurality of first contact points and a plurality of second contact points, the first package encapsulating the lead-frame but exposing the first contact points and the second contact points; and
    coupling an input/output module with the base by coupling and electrically connecting the input/output module and the first contact points, the input/output module comprising:
        a first substrate being a wafer and having a first surface and a second surface;
        a plurality of first conductive panels formed on the first surface;
        a plurality of first conducting columns disposed inside the first substrate, wherein one end of each of the first conducting columns is electrically connected to the first conductive panels; and
        an input/output circuit formed on the second surface, electrically connected to another end of each of the first conducting columns, and having a plurality of second conductive panels each electrically connected to a corresponding one of the first contact points.

7. The method of claim 6, wherein the second conductive panels are coupled and electrically connected to the first contact points via a plurality of solder balls.

8. The method of claim 6, further comprising a step of coupling a core module with the input/output module by coupling and electrically connecting the core module and the input/output module, the core module comprising:
    a second substrate having a third surface, wherein a plurality of fourth contact points is disposed on the third surface and coupled and electrically connected to the first conductive panels; and
    a core circuit formed inside the second substrate and electrically connected to the fourth contact points.

9. The method of claim 8, wherein the fourth contact points are coupled and electrically connected to the first conductive panels via a plurality of solder balls.

10. The method of claim 9, further comprising a step of performing integrated packaging for packaging the base, the input/output module, and the core module and still exposing the second contact points, by coupling a second package and the first package.

* * * * *